United States Patent
Park

(10) Patent No.: US 6,401,179 B1
(45) Date of Patent: Jun. 4, 2002

(54) METHOD FOR STORING REFERENCE INFORMATION AND APPARATUS THEREFOR

(75) Inventor: Ju-ha Park, Yongin (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/387,904

(22) Filed: Sep. 1, 1999

(30) Foreign Application Priority Data

Sep. 5, 1998 (KR) ............................................ 98-36627

(51) Int. Cl.$^7$ ............................................ G06F 12/00
(52) U.S. Cl. ........................................................ 711/165
(58) Field of Search ................................. 711/162, 165, 711/157, 161

(56) References Cited

U.S. PATENT DOCUMENTS

| | | | | |
|---|---|---|---|---|
| 5,617,543 A | | 4/1997 | Phillips ........................ 395/250 |
| 5,701,437 A | * | 12/1997 | Kinjo et al. ................. 395/489 |
| 5,742,792 A | * | 4/1998 | Yanai et al. ................. 395/489 |
| 5,749,093 A | * | 5/1998 | Kobayashi et al. .......... 711/139 |
| 5,751,993 A | * | 5/1998 | Ofek et al. ................... 395/463 |
| 5,761,678 A | * | 6/1998 | Bendert et al. .............. 707/204 |
| 5,790,427 A | | 8/1998 | Greer et al. ................. 364/556 |
| 5,829,034 A | * | 10/1998 | Hagersten et al. ........... 711/141 |
| 5,829,046 A | * | 10/1998 | Tzelnic et al. ............... 711/162 |
| 5,974,485 A | | 10/1999 | Kruschinski ................. 710/52 |
| 6,044,444 A | * | 3/2000 | Ofek ............................ 711/162 |
| 6,078,990 A | * | 6/2000 | Frazier ........................ 711/114 |
| 6,173,377 B1 | * | 1/2001 | Yanai et al. ................. 711/162 |

FOREIGN PATENT DOCUMENTS

| | | | |
|---|---|---|---|
| EP | 0 416 281 | 7/1990 | ............. G06F/5/06 |
| EP | 0 854 425 | 8/1997 | ........... G06F/11/20 |
| JP | 9-73417 | 3/1997 | |
| WO | WO 96/31980 | 10/1996 | ........... H04N/5/445 |
| WO | WO 96/35986 | 11/1996 | ............. G06F/3/06 |
| WO | WO 98/27723 | 6/1998 | ........... H04N/5/445 |

* cited by examiner

*Primary Examiner*—Matthew Kim
*Assistant Examiner*—Christian P. Chace
(74) *Attorney, Agent, or Firm*—Sughrue Mion, PLLC

(57) ABSTRACT

A method for alternately storing reference information in two memories in order to prevent the reference information from being damaged by storage errors in a system for storing reference information in a memory and an apparatus therefor are provided. The apparatus for storing the reference information includes at least two memories for storing reference information, a flag storing unit for storing a flag displaying a memory in which effective reference information is stored among the memories, a recording path setting unit for determining a memory in which the reference information is to be recorded with reference to the state of the flag stored in the flag storing unit, setting the recording path so that the reference information is recorded in a second memory when a first memory is effective, and the reference information is recorded in the first memory when the second memory is effective, a recorder for recording the reference information in the memory set by the recording path setting unit, and a flag setting unit for setting the flag of the flag storing unit to show the effective state of a concerned memory only after the recording of the reference information in the memory set by the recording path setting unit has been completed. Thus, it is possible to safely store the reference information even if storage errors are generated by alternately recording the reference information of the system on two memories or recording regions and displaying the memory region to be used.

9 Claims, 5 Drawing Sheets

METHOD FOR STORING REFERENCE INFORMATION AND APPARATUS THEREFOR

BACKGROUND OF THE INVENTION

1. Field of the Invention

The present invention relates to a method for storing information in a memory and an apparatus therefor, and more particularly, to a method for storing guide information in which the guide information is alternately recorded in two memories in order to prevent the guide information from being damaged by a storage error in a system for storing the guide information in a memory and an apparatus therefor.

2. Description of the Related Art

The term "backup" means making one or more copies of files or data for a case where original files or data are damaged. For example, in Windows 95 (Windows 95 is a registered trademark of Microsoft Co., Ltd.), a registry is a data file which includes various information items required for executing Windows 95 such as information on which video cards, modems, and sound cards are installed and information on current resolution, the current state of a window, and shapes of letters.

Windows 95 automatically makes backup files (system.da0 and user.da0) of system registry files (system.dat and user.dat) which are the most important files.

When an error occurs during the booting of Windows 95, a user should copy system.da0 and user.da0 to system.dat and user.dat in a DOS mode (DOS is a registered trademark of Microsoft Co., Ltd.)

In a general computer system, a user can access an operating system (OS) and recover files by using the backup files. However, the recovery of files in television sets, video tapes, and recorders cannot be performed by using backup files.

Even in a general computer system, it is difficult to recover files when a system goes down during the creation of the backup files, since the backup files are damaged.

For example, in the case of a digital multi-channel receiver, electric program guide (EPG) information is stored in an electrically erasable and programmable ROM (EEPROM), and a FLASH memory, etc. New information should be recorded after erasing previously recorded information due to the characteristics of a re-recordable non-volatile memory.

The EPG information can be obtained from periodically received EPG information or according to the needs of the user. Newly obtained EPG information is recorded after erasing all the EPG information stored in the non-volatile memory. When the system goes down due to a power failure or a breakdown of the power supply, both the new EPG information and the previous information may be lost. Therefore, new EPG information should be obtained.

When there are many channels, it takes much time to obtain the EPG information. During this time, the user should wait for the EPG information to be obtained.

Such a problem can be more severe in the case of a digital multi-channel receiver in a region where power supply and demand is unstable.

SUMMARY OF THE INVENTION

To solve the above problem, it is an object of the present invention to provide an improved method for safely recording information referred to by a system.

It is another object of the present invention to provide an apparatus suitable for the above method.

Accordingly, to achieve the first object, there is provided a method for storing guide information in a memory in a computer system, comprising the steps of checking whether currently referred information is recorded in a first memory, recording new guide information in a second memory when the currently referred information is recorded in the first memory, resetting a first flag showing that the first memory is effective and setting a second flag showing that a second memory is effective only after the new guide information has been completely recorded in the second memory, recording the new guide information in the first memory when the currently referred information is not recorded in the first memory, and resetting the second flag showing that the second memory is effective and setting the first flag showing that the first memory is effective.

To achieve the second object, there is provided an apparatus for storing guide information, comprising at least two memories for storing guide information, a flag storing unit for storing a flag displaying a memory in which effective guide information is stored among the memories, a recording path setting unit for determining a memory in which the guide information is to be recorded with reference to the state of the flag stored in the flag storing unit, setting the recording path so that the guide information is recorded in a second memory when a first memory is effective, and the guide information is recorded in the first memory when the second memory is effective, a recorder for recording the guide information in the memory set by the recording path setting unit, and a flag setting unit for setting the flag of the flag storing unit to show the effective state of a concerned memory only after the recording of the guide information in the memory set by the recording path setting unit has been completed.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Hereinafter, the structure and operation of the present invention will be described in detail with reference to the attached drawings.

In explaining the embodiment and operation of the method for storing guide information according to the present invention, an example of storing electric program guide (EPG) information in a digital multi-channel receiver will be taken as an example for the convenience of explanation.

Program information for conventional analog TV broadcasting is generally provided by publications such as newspapers, and magazines. However, since several tens through several hundreds of channels are provided by digital multi-channel broadcasting, there is much room for viewers to select programs, and selection of programs becomes extremely complicated.

In such digital multi-channel broadcasting, the electric program guide (EPG) for providing a program list or information on contents of the respective programs is a basic data service.

In general, channel numbers, the names of channels, the names of programs, and schedules, which are transmitted as data, are displayed on a TV screen by the EPG software of the receiver as a program list having a temporal axis and a channel axis. A user can select channels or perform programmed recording in the program list by manipulating a cursor.

Figure 1:
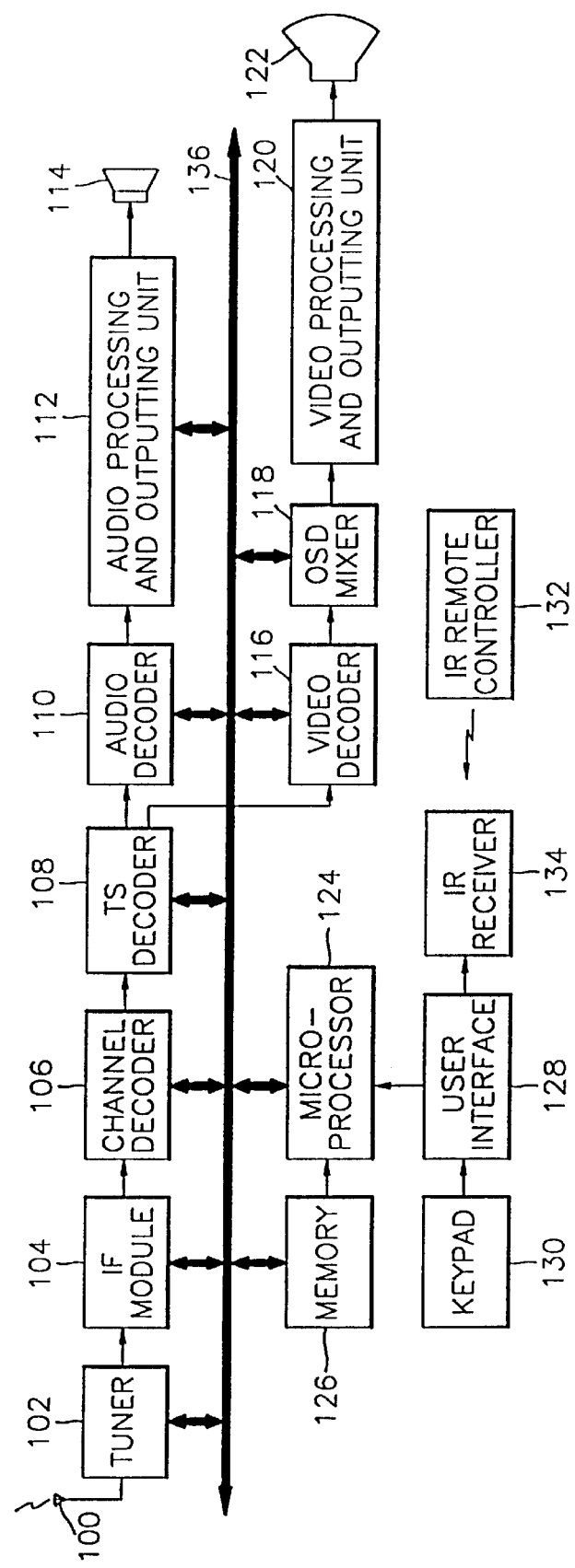
FIG. 1 is a block diagram showing the structure of a conventional digital multi-channel TV (DTV) set.

FIG. 1 is a block diagram showing the structure of a conventional digital multi-channel TV (DTV) receiver. In the apparatus shown in FIG. 1, a tuner 102 selects one RF channel in a received broadcasting signal through an antenna 100 according to the control of a microprocessor 124. Accordingly, the intermediate frequency (IF) signal of the selected channel is output from the tuner 102. The baseband signal of the selected channel is output from an IF module 104 to a channel decoder 106.

The channel decoder 106 channel decodes the baseband signal received from the IF module 104 and reproduces a data bit stream. The reproduced data bit stream is divided into audio data, video data, and additional data by a transport stream (TS) decoder 108.

The audio data is applied to an audio decoder 110, where it is decoded according to the MPEG standard or the Dolby AC-3 standard, processed by an audio processing and outputting unit 112, and output as a voice through a speaker 114.

The video data is applied to a video decoder 116, where it is decoded according to the MPEG standard, applied to an on screen display (OSD) mixer 118, mixed with OSD data generated by the microprocessor 124, processed by a video processing and outputting unit 120, and output on a screen through a picture tube 122. Here, the OSD data is for the microprocessor 124 which graphically or textually display various kinds of information on the screen.

A keypad 130 and an infra red (IR) receiver 134 are connected to the microprocessor 124 which is the controller of a DTV picture receiver through a user interface 128. The microprocessor 124 performs operations according to various manipulation commands received from an IR remote controller 132 by the IR receiver 134 and from the keypad 130, according to the programs stored in a memory 126. Here, a wireless mouse such as an air mouse or a remote controller can be used as the IR remote controller 132.

The commands applied from the IR remote controller are received by the IF receiver 134 as an IF signal and applied to the microprocessor 124 through the user interface 128. The TS decoder 108 supplies additional data to the microprocessor 124. The above-mentioned EPG information is included in the additional data.

The memory 126 includes a ROM for storing the programs of the microprocessor 124, a RAM for temporarily storing data according to the execution of the programs of the microprocessor 124, and an EEPROM for storing various reference data.

The tuner 102, the IF module 104, the channel decoder 106, the TS decoder 108, the audio decoder 110, the audio processing and outputting unit 112, the video decoder 116, the OSG mixer 118, the video processing and outputting unit 120, and the memory 126 are connected to the microprocessor 124 through a bus 136.

Figure 2:
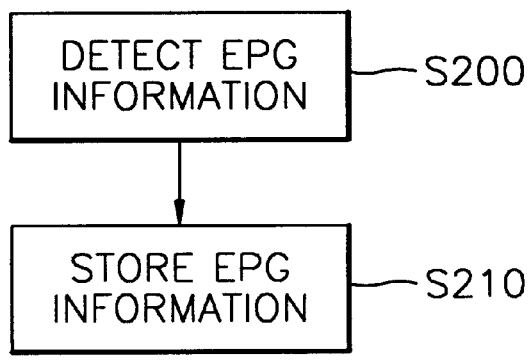
FIG. 2 is a flowchart showing a conventional method for storing program guide information in the apparatus shown in FIG. 1.

FIG. 2 is a flowchart showing a conventional method for storing the EPG information in the apparatus shown in FIG. 1. When a program guide command is input from the user through the keypad 130, the apparatus goes to the program guide mode shown in FIG. 2. In the program guide mode, all channels which can be accessed by the tuner 102 are scanned and the EPG information of each channel is obtained (step 200). That is, under the control of the microprocessor 124, the tuner 102 scans all possible channels, and the microprocessor 124 detects the EPG information of each channel received through the tuner 102 (step 200).

The obtained EPG information is stored in the memory 126. Since the EPG information is transmitted in ea channel, the microprocessor 124 obtains the EPG information of a concerned channel whenever the channel is changed and stores the EPG information in the memory 126 (step 210).

In general, the EPG information is stored in a re-recordable non-volatile memory such as a FLASH memory or an EEPROM. According to the characteristics of the re-recordable non-volatile memory, new information should be recorded after erasing all information which is previously recorded.

Since the EEPROM should be selectively erased using a large current or a high voltage from the outside, it is difficult to erase information on a cell-by-cell basis of a cell. Therefore, a certain region or the entire memory is erased at one time.

Namely, in the conventional method shown in FIG. 2, since the newly obtained EPG information is recorded after erasing all information which is previously recorded, the EPG information can be lost by mis-recording.

For example, if the electricity is cut while the obtained EPG information is recorded, since the parts which are not recorded are lost, it is not possible to keep all the EPG information.

Figure 3:
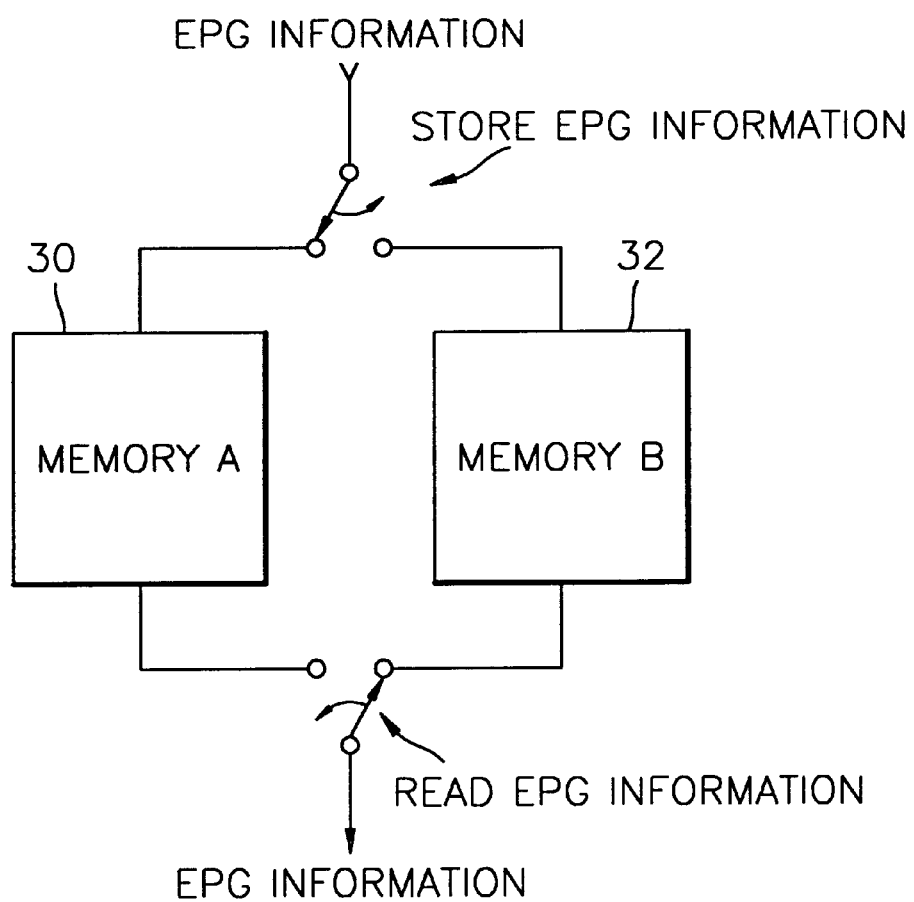
FIG. 3 schematically shows a method for storing information according to the present invention.

FIG. 3 schematically shows a method for storing the EPG information according to the present invention. As shown in FIG. 3, the EPG information is alternately recorded in a first memory 30 and a second memory 32.

If the previous EPG information is to be stored in the first memory 30, the newly obtained program guide information is stored in the second memory 32. When the program EPG information is stored in any of the memories 30 and 32, the content stored in the memory is erased and the newly obtained EPG information is stored.

Even if the recording operation is stopped due to a power failure while the obtained EPG information is being recorded in the second memory 32, the EPG information is not completely lost since the previous EPG information is recorded in the first memory 30.

Since EPG information for a minimum of 3 hours and a maximum of 384 hours is transmitted at 3-hour intervals according to the ATSC standard, the probability of completely losing the EPG information is extremely small if the EPG information is obtained within 384 hours.

When the new EPG information is obtained, the new EPG information is recorded in the first memory 30.

As mentioned above, in the method according to the present invention, the influence of errors during recording is minimized by alternately storing the obtained EPG information in two memories.

Figure 4:
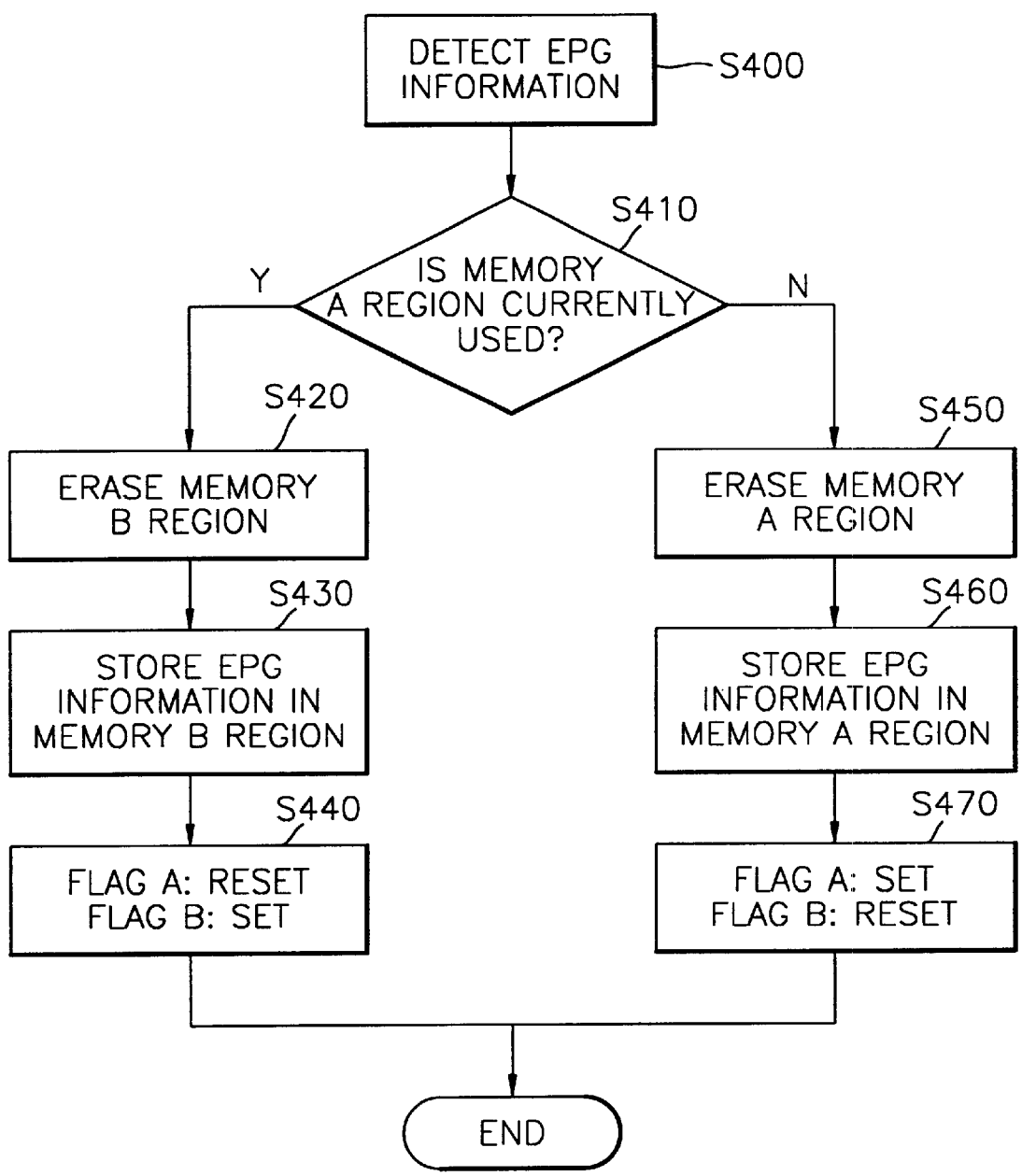
FIG. 4 is a flowchart showing an embodiment of the method for storing information according to the present invention.

FIG. 4 is a flowchart showing a method for storing the EPG information according to the present invention. First, the EPG information is obtained in step 400.

In step 410, it is checked whether the currently used memory is the memory A. When the currently used memory is the memory A, the content of the memory B is erased (step 420).

The obtained EPG information is stored in the memory B (step 430).

When the obtained EPG information is completely recorded in the memory B, the flag A showing that the memory A is effective is reset, the flag B showing that the memory B is effective is set, and the process is terminated (step 440).

If the currently used memory is not the memory A in the step 410, the content of the memory A is erased (step 450).

The obtained EPG information is recorded in the memory A (step 460).

When the obtained EPG information is completely recorded in the memory A, the flag B showing that the memory B is effective is reset, the flag A showing that the memory A is effective is set, and the process is terminated (step 470).

When the EPG information is displayed, the effective memory is examined with reference to the flag A and the flag B, a program list is prepared using the EPG information stored in the effective memory, and the program list is displayed.

Even if the electricity is cut while the EPG information is being stored in the memory A, since the flag showing that the memory B is effective is not reset, the content of the memory B is referred to when the program list is displayed afterward. Therefore, the EPG information remains safe.

The memory A and the memory B need not be two physically separate memories. The EPG information can be recorded on two different regions in one memory.

Figure 5:
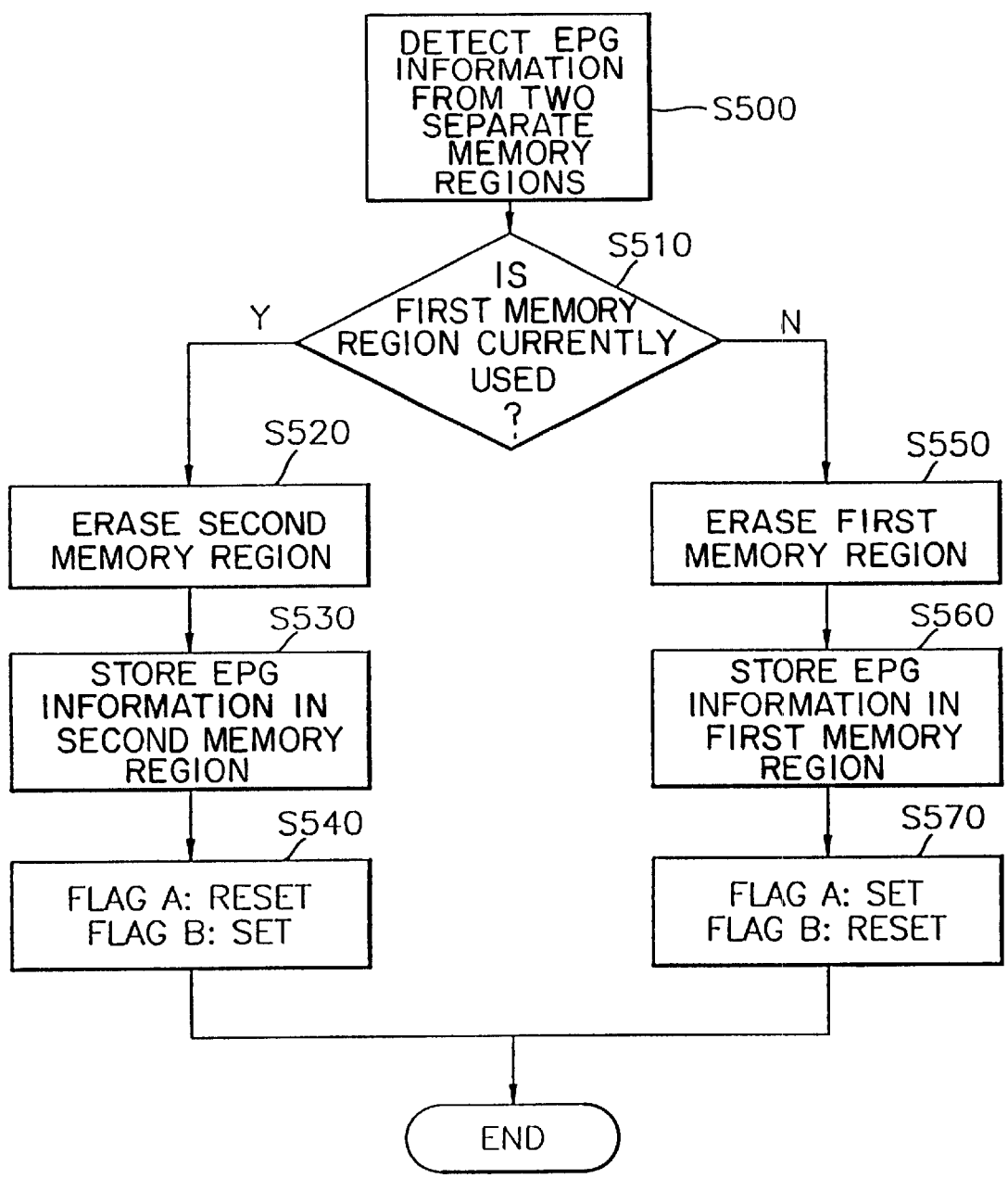
FIG. 5 is a flowchart showing another embodiment of the method for storing information according to the present invention.

FIG. 5 is a flowchart showing an example of recording the obtained EPG information on two separate memory regions. First, the EPG information is obtained in step 500.

In step 510, it is checked whether the currently used region is the first memory region. If the currently used region is the first memory region, the content of the second memory region is erased (step 520).

The obtained EPG information is stored in the second memory region (step 530).

When the obtained EPG information is completely recorded in the second memory region, the flag A showing that the first memory region is effective is reset, the flag B showing that the second memory region is effective is set, and the process is terminated (step 540).

When the currently used region is not the first memory region in the step 510, the content of the first memory region is erased (step 550).

The obtained EPG information is recorded on the first memory region (step 560).

When the obtained EPG information is completely recorded on the first memory region, the flag B showing that the second memory region is effective is reset, the flag A showing that the first memory region is effective is set, and the process is terminated (step 570).

Figure 6:
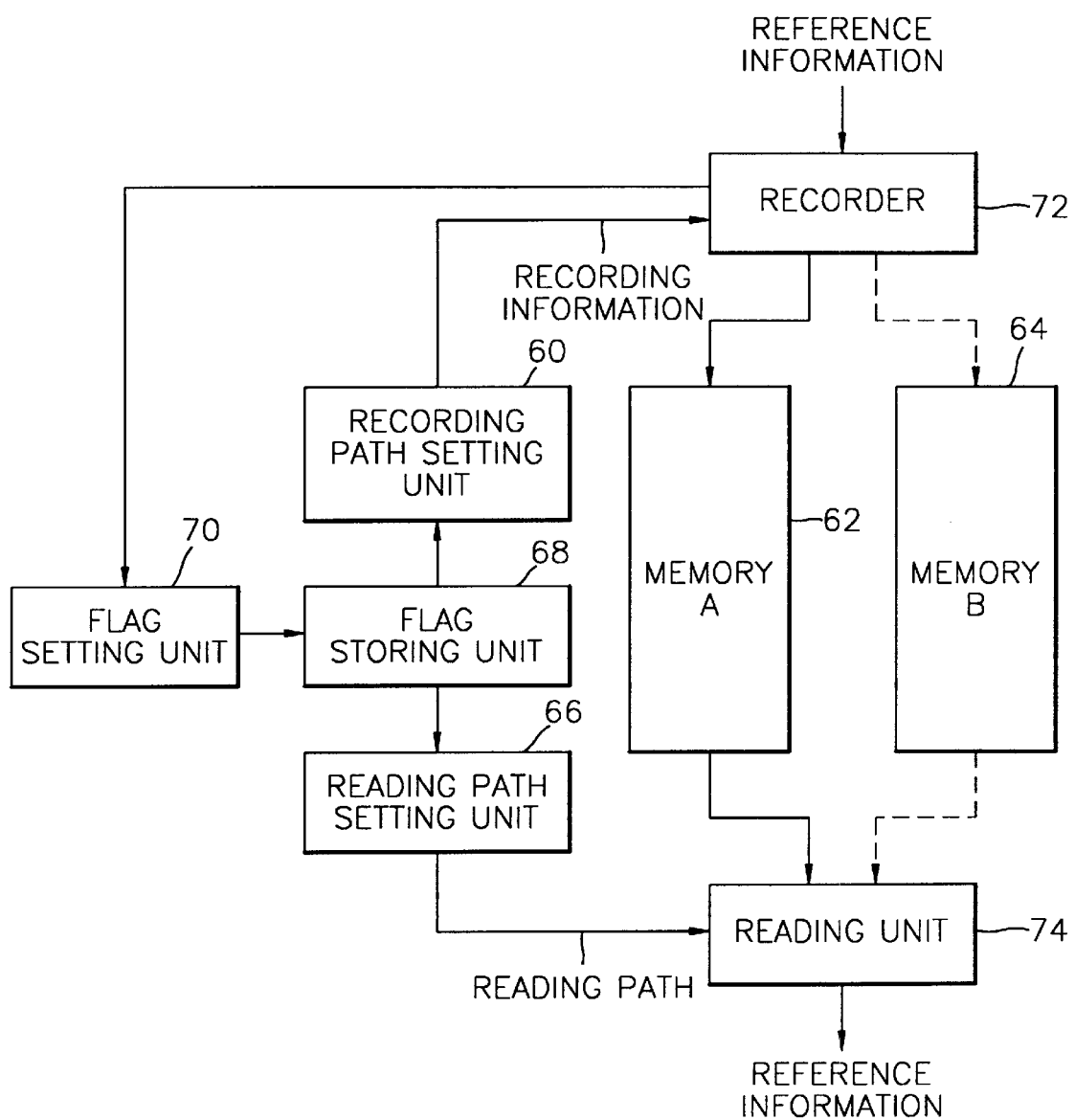
FIG. 6 is a block diagram showing the structure of a preferred embodiment of an apparatus for storing information according to the present invention.

FIG. 6 is a block diagram showing the structure of the apparatus according to the present invention. The apparatus shown in FIG. 6 includes a recording path setting unit 60, memories 62 and 64, a reading path setting unit 66, a flag storing unit 68, a flag setting unit 70, a recorder 72, and a reading unit 74.

The recording path setting unit 60 determines in which memory the guide information is to be recorded with reference to the state of the flag stored in the flag storing unit 68. To be specific, when the memory A 62 is effective, the recording path setting unit 60 sets the recording path so that the guide information is recorded in the memory B 64 and vice-versa.

The reading path setting unit 66 determines the memory from which the guide information is to be read with reference to the state of the flag stored in the flag storing unit 68.

The flag setting unit 70 sets the flag showing the effective state of a concerned memory and resets the flag showing the effective state of another memory in the flag storing unit 68 after the recording of the guide information in the memory is completed. For example, when the guide information is recorded in the memory A 62, the flag A is set and the flag B is reset. When the guide information is recorded in the memory B 64, the flag B is set and the flag A is reset.

The recording unit 72 unit records the guide information in the memory set by the recording path setting unit 60.

The reading unit 74 reads the guide information from the memory set by the reading path setting unit 66.

As mentioned above, according to the method for storing the guide information according to the present invention and the apparatus therefor, it is possible to safely store the guide information even if storage errors are generated, by alternately recording the guide information of the system in two memories or recording regions and displaying the memory region to be used.

What is claimed is:

1. A method for storing guide information in memory in a computer system, comprising the steps of:

checking whether current guide information is recorded in a first memory location;

recording new guide information in a second memory location when the current guide information is recorded in the first memory location;

resetting a first flag showing the effective state of the first memory location and setting a second flag showing the effective state of the second memory location after the new guide information has been completely recorded in the second memory location;

recording the new guide information in the first memory location when the current guide information is not recorded in the first memory location; and resetting the second flag showing the effective state of the second memory location and setting the first flag showing the effective state of the first memory location.

2. A method for storing information in a digital multi-channel receiver, comprising the steps of:

checking whether a first memory location is storing current information;

recording new information in a second memory location if the first memory location is storing current information;

resetting a first flag showing that the first memory location is not storing current information and setting a second flag showing that the second memory location is storing current information after the new information has been completely recorded in the second memory location;

recording new information in the first memory location if the first memory location is not storing current information; and resetting the second flag showing that the second memory location is not storing current information and setting the first flag showing that the first memory location is storing current information after new information is completely recorded in the first memory location.

3. The method of claim 2, wherein the first memory location and the second memory location occupy different regions in a singe memory device.

4. The method of claim 2, wherein the first memory location and the second memory location are realized by different memory devices.

5. An apparatus for storing guide information, comprising:

at least two memory locations for storing a current guide information and a new guide information;

a flag storing unit for storing a flag indicative of the effective state of the memory locations;

a recording path setting unit for determining which memory location to record the new guide information in based on the state of the flag stored in the flag storing unit and for setting the recording path so that the new guide information is recorded in a second memory location when a first memory location is storing the current guide information, and the new guide information is recorded in the first memory location when the second memory location is storing the current guide information;

a recorder for recording the new guide information in a memory location set by the recording path setting unit; and a flag setting unit for setting the flag of the flag storing unit to show the effective state of the memory locations only after the recording of the guide information in the memory set by the recording path setting unit has been completed.

6. The apparatus of claim 5, further comprising:

a reading path setting unit for determining a memory location from which the guide information is to be read based on the state of the flag stored in the flag storing unit; and a reading unit for reading the guide information from the memory location set by the reading path setting unit.

7. An apparatus for storing guide information, comprising:

memory means for storing a current guide information and a new guide information in at least a first and a second memory location;

flag setting means for setting at least a first flag indicating whether the current guide information is present in the first or second memory location;

flag storing means for storing the at least first flag;

recording path setting means for setting a new memory location, chosen from the at least first and second memory location based on the at least first flag, in which the new guide information is stored; and recording means for recording the new guide information in the new memory location set by the recording path setting means;

whereby the new guide information is recorded in the new memory location and the current guide information remains available in the event that the new guide information is not properly recorded.

8. An apparatus for storing guide information as recited in claim 7, further comprising:

reading path setting means for setting a memory location, chosen from the at least first and second memory location based on the at least first flag, from which the guide information is read; and reading means for reading the guide information from the memory location set by the recording path setting means.

9. The method of claim 2, wherein the information is program guide information.

* * * * *